United States Patent [19]

Hopwood et al.

[11] 4,009,448
[45] Feb. 22, 1977

[54] PHASE LOCK LOOP FOR A VOLTAGE CONTROLLED OSCILLATOR

[75] Inventors: Francis W. Hopwood, Severna Park; Lester K. Staley, Baltimore, both of Md.

[73] Assignee: Westinghouse Electric Corporation, Pittsburgh, Pa.

[22] Filed: Jan. 6, 1976

[21] Appl. No.: 646,800

[52] U.S. Cl. ............................... 331/4; 331/9; 331/12; 331/36 C
[51] Int. Cl.[2] .............................. H03B 3/04
[58] Field of Search ............. 331/4, 9, 12, 36 C, 331/31

[56] References Cited

UNITED STATES PATENTS

| 2,969,458 | 1/1961 | Parkinson | 331/4 |
|---|---|---|---|
| 3,091,740 | 5/1963 | Murphy, Jr. | 331/12 |
| 3,825,855 | 7/1974 | Basset et al. | 331/4 |
| 3,852,682 | 12/1974 | Dawe et al. | 331/4 |

*Primary Examiner*—John Kominski
*Attorney, Agent, or Firm*—R. M. Trepp

[57] ABSTRACT

A phase lock loop configuration having a voltage controlled oscillator utilized, for example, in radar systems wherein false locking is prevented and loop bandwidth is maintained substantially constant. The voltage controlled oscillator includes a cavity resonator within which is located two tuning varactor diodes, one of which is heavily coupled to the resonator and comprises a coarse tuning port and one of which is lightly coupled and comprises the fine tuning port. The configuration is such that when the loop is locked, following a sweep mode of the coarse tuning voltage, the fine tune voltage is held constant at a predetermined DC level thereby making the fine tuning sensitivity essentially constant as the coarse tuning voltage changes the frequency over the band of interest.

10 Claims, 3 Drawing Figures

PHASE LOCK LOOP FOR A VOLTAGE CONTROLLED OSCILLATOR

The invention herein described was made in the course of or under a contract or subcontract thereunder, with the Department of the Air Force.

BACKGROUND OF THE INVENTION

1. Field of the Invention

The present invention relates generally to frequency tracking systems in radar receivers and more particularly to a system for acquiring and tracking a variable frequency signal with a local oscillator while preventing a false lock of the local oscillator on an incorrect e.g. a image frequency, instead of the correct frequency, and while holding the loop bandwidth substantially constant.

2. Description of the Prior Art

Typically, a phase lock loop for radar applications includes a stable, crystal controlled microwave reference source, a VHF crystal offset oscillator, and a microwave voltage controlled oscillator (VCO) which is phase locked to the crystal references. Such loops have been and continue to be plagued with two distinct types of problems, namely, false locking and variations in loop bandwidth due to RF power variation and non-linearity in the tuning characteristic of the VCO.

SUMMARY

Briefly, the subject invention is directed to an improved phase locked loop for radar apparatus and having the important properties of allowing an acquisition sweep to tune the VCO over an arbitrarily large tuning range without the possibility of either mirror image or subharmonic false locks while maintaining essentially constant loop bandwidth without requiring the VCO to tune linearly. The improvement comprises placing two tuning varactor diodes within a cavity resonator, forming part of the VCO. The two diodes have dissimilar coupling ratios with the more heavily coupled varactor forming a coarse tuning port which is used to tune the VCO frequency across the band of interest as determined by a coarse tuning voltage applied thereto which is additionally adapted to be swept during a search mode. The more lightly coupled varactor diode serves as a fine tuning port following the application of a fine tune voltage. A sweep circuit consisting of an integrator and a hysteresis amplifier slowly sweeps the coarse tuning voltage moving the VCO frequency across the entire band of operation. The VCO output frequency is mixed with the reference frequency in an IF mixer and the output applied to an IF amplifier and limiter whose IF output is mixed with the frequency output of an offset oscillator using inphase "I" and quadrature "Q" mixers. The output of the "I" mixer is fed to a threshold circuit which is adapted to render the sweep circuit inoperative as the VCO reaches the correct locking frequency. The integrator coupled to the coarse tuning port is then connected to the output of the video amplifier which is driven by the "Q" mixer. The video amplifier also feeds the fine tuning port. Under these conditions, the fine tuning voltage is held at a predetermined constant DC level, because the coarse tuning port acts to change the VCO frequency in the proper direction to always bring the fine tuning voltage back to the predetermined constant DC level, whereupon the fine tuning sensitivity remains essentially constant as the coarse tuning voltage changes. This permits the phase lock loop bandwidth to remain substantially constant and produce similar performance across the band of interest.

DESCRIPTION OF THE PREFERRED EMBODIMENT

Figure 1:
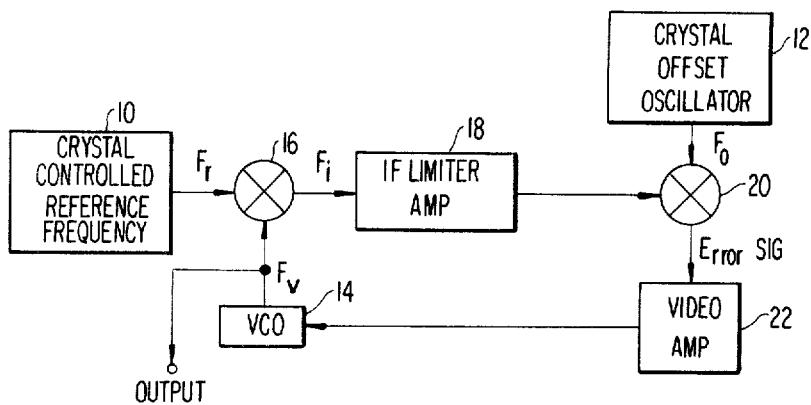
FIG. 1 is an electrical block diagram illustrative of a typical prior art phase lock loop for radar applications.

Prior to discussing the subject invention in detail, additional consideration is directed at prior art apparatus and its attendant problem areas. Accordingly, reference is now made to the block diagram shown in FIG. 1, which discloses a typical phase lock loop for radar application and one having a stable, crystal controlled microwave reference source 10, a VHF crystal offset oscillator 12, and a microwave voltage controlled oscillator 14 hereinafter referred to as a VCO which is phase locked to the reference source 10 and offset oscillator 12. Where the microwave reference frequency, the offset frequency, and the VCO frequency are designated $F_r$, $F_o$, and $F_c$, respectively, the VCO frequency $F_v$ is locked to the sum of $F_r$ and $F_o$, that is $F_c = F_r + F_o$. The frequency $F_v$ from the VCO 14 is mixed with the reference frequency $F_r$ from the source 10 in a mixer 16 whereupon an IF frequency $F_i = F_o$ at phase lock is provided at its output. This IF frequency is fed to an IF limiter amplifier 18, whose output is applied to a second mixer 20, which also has the frequency $F_o$ applied thereto from the offset oscillator 12. The mixer 2o then acts as a phase detector providing a video error signal output whose amplitude is minimum when $F_i$ and $F_o$ are equal but becoming greater as the frequency difference therebetween increases. The error signal output from the mixer 20 is coupled back to the tuning port of the VCO 14 by means of a video error signal amplifier 22.

It is to be noted that the closed loop thus defined depends upon the IF frequency $F_i$, appearing at the output of the IF limiter amplifier 18. If the VCO 14 is mistuned, such that $F_v = F_r - F_o$, an IF frequency $F_i = F_o$ is again generated due to the heterodyne action of the mixer 16 and therefore the loop can lock resulting in a "mirror image" false lock condition. In addition, if the VCO 14 outputs frequencies $F_v = R \pm F_{o/N}$ where $N$ is an odd integer, the RF limiter amplifier 18 will provide harmonics of $F_o$, resulting in a multiplicity of subharmonic false lock conditions. One might suggest that subharmonic false locking could be eliminated by removing the limiter amplifier 18 and/or including a bandpass filter between the mixer 12 and the limiter amplifier 18. Satisfactory solutions are thus provided for some applications, particularly when the IF frequency is large and/or the phase lock bandwidth is narrow. Unfortunately, it is often the case that power variations from unit to unit across a band necessitate the existence of the limiter amplifier 16 lest the loop gain vary drastically. It has also been found that restricting the IF bandpass by filtering tends to degrade the servo loop phase response in many cases where the loop bandwidth is an appreciable fraction of the If center frequency. In addition, the inclusion of filters tends to add needless size and complexity to the system. Another satisfactory but complex solution to the subharmonic lock problem is to replace the IF limiter amplifier 16 with a receiver automatic gain control (AGC) circuit; however, this leaves the mirror image lock problem unsolved.

A classic approach to the false lock problem and one in which often fails, is to tune the VCO to the correct frequency by means of a precise tuning voltage or mechanical adjustment and then restrict the range of the loop acquisition sweep such that the VCO is supposedly never driven to a false lock frequency. This approach is failure prone in that typical VCO temperature drift and ageing characteristics are such that an acquisition sweep range which is sufficiently narrow to prevent false lock is often too narrow to guarantee that the VCO will be swept to the correct lock frequency under all circumstances. The result is that frequent alignment or preposition potentiometer adjustments are necessary to force the loop to lock. While frequent adjustments can be carried on for laboratory set ups and experimental models, it becomes intolerable for production systems which must perform for long periods of time without the requirement of maintenance.

It should also be pointed out that the phase lock servo bandwidth is proportional to the product of the VCO tuning sensitivity, the phase detector sensitivity, and the video amplifier gain. Accordingly, there are many applications where substantial variation in the loop bandwidth is harmless; however, the "Stalo" phase noise performance in some radar systems is dependent upon choosing and maintaining an optimum loop bandwidth. In fact, the noise performance is often the reason for utilizing a phase lock loop as opposed to some other type of configuration. While it is not necessary to elaborate further, suffice it to say that the noise performance of certain radar systems is dependent upon maintaining an essentially constant phase lock loop bandwidth.

Variations in loop bandwidth are attributed to power variations at the input to the phase detector or mixer 20 and variations in the tuning sensitivity of the VCO 14 as it is tuned across a band which is a result of a typically non-linear tuning curve and differs from unit to unit. This contribution is normally removed by the limiter circuitry in the IF limiter amplifier 16. One obvious way to remove the loop bandwidth variation due to VCO tuning non-linearity is to design a VCO with a linear tuning curve either directly or by virtue of a diode array or some other type of linearization network. Unfortunately, direct VCO linearization techniques generally result in lower VCO resonator Q and substantially degraded VCO noise performance. Furthermore, diode linearization techniques tend to be unacceptable for two reasons. First, they must usually be hand tailored, which is undesirable for a large scale production run and they inherently display a fine grain linearity structure which results in loop bandwidth variations.

Figure 2:
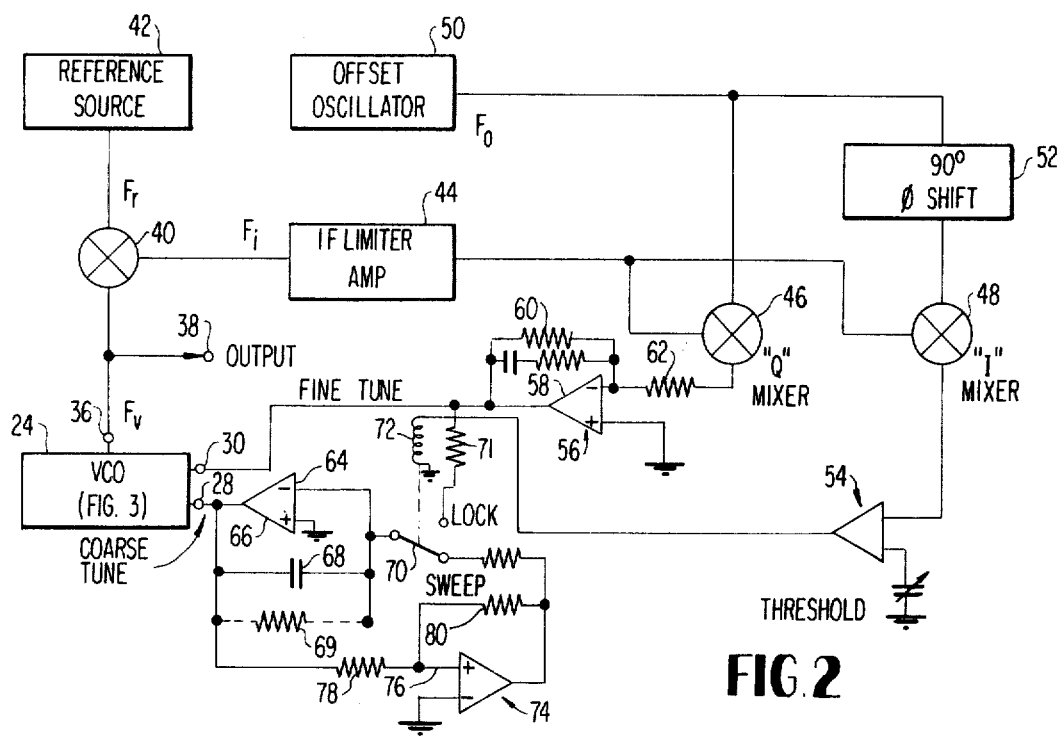
FIG. 2 is an electrical block diagram illustrative of the preferred embodiment of the subject invention.

Referring now to the subject invention in detail, FIG. 2 discloses a phase lock loop having the important properties of permitting tuning of the VCO over an arbitrarily large tuning range including an acquisition sweep without the possibility of either mirror image or subharmonic false lock, while at the same time maintaining substantially constant loop bandwidth without the requirement of a linearly tuned VCO. The embodiment shown includes a VCO 24, including a cavity resonator 26 shown in detail in FIG. 3 and having a coarse tuning port 28 and a fine tuning port 30, respectively coupled to a varactor diode 32 and 34 located within the resonator 26. An output port 36 couples to a signal output terminal 38 and an IF mixer 40 which is also coupled to a reference frequency source 42 similar to the crystal control reference frequency source 10 shown in FIG. 1.

The output of the mixer 40 is fed to an IF limiter-amplifier 44, the output of which is commonly fed to a "Q" or quadrature mixer 46 and an "I" or inphase mixer 48. An offset oscillator 50 has its output directly connected to the "Q" mixer 46 and to the "I" mixer 48 through a 90° phase shifter 52. The mixers 46 and 48 operate as phase detectors, inasmuch as the two respective inputs are of the same frequency $F_i = F_o$ in a phase locked condition. The "I" mixer 48 is utilized in combination with the 90° phase shifter 52 to operate as a quadrature phase detector, a circuit well known to those skilled in the art, which compares the phase of the signals from the offset oscillator 50 and the output of the IF limiter-amplifier 44 to provide an increase in amplitude of the output of the mixer 48 as the phase of the two signals approaches a locked condition.

The "Q" mixer 46, on the other hand, is adapted to operate once a phase lock condition takes place, and provides a minimal output from the mixer 46 for phase coherence between the signals applied, but increases as the phase deviates from a lock condition. The output of the "I" mixer 48 is fed to a threshold device 54, while the output of the "Q" mixer 46 is coupled to a video amplifier 56 which is similar to the video amplifier 20, shown in FIG. 1, inasmuch as the output of the "Q" mixer 46 provides an error signal output similar to the output of the phase detector mixer 18 of FIG. 1. The video amplifier 56 is comprised of an operational amplifier 58 having a R-C feedback network 60 and an input coupling resistor 62. The output of the video amplifier 56 is directly connected to the fine tuning port 30 and is also selectively coupled during phase lock to the coarse tuning port 28 through an integrator circuit 64 comprised of an operational amplifier 66 and a feedback capacitor 68. Switch contacts 70 which are shown as relay contacts but may be any type of switch e.g. electronic, are operated in response to the energization of a relay coil 72 coupled to the output of the threshold device 54 to provide the coupling. If another type of switch is utilized, the relay coil 72 would be replaced by suitable driver means. Prior to phase lock, the relay coil 72 is unenergized and the relay contacts 70 couple the input of the integrator circuit 64 to a hysteresis amplifier 74 whose input 76 is coupled to the output of the integrator 64 by means of a resistor 78. A feedback resistor 80 couples from the output of the amplifier 76 to its input. A sweep circuit for the VCO is thus provided.

Prior to discussing the operation of the embodiment shown in FIG. 2, reference will first be made to a schematic diagram of a typical VCO shown in FIG. 3. The circuit comprises a cavity resonator oscillator shown for purposes of explanation but not restricted to a Clapp type circuit a grounded collector transistor 82 whose base is connected to a variable capacitance coupling probe 84 which couples to a cavity resonator 26, which comprises a coaxial resonator having a center conductor 86 and an output conductor 88. The important feature in the present invention is the presence of the two varactor diodes 32 and 34 in the resonator. The variable capacitance coupling probe 84 is connected to the center conductor 86 which also has the varactor 32 coupled thereto as well as a mechanical tuning adjustment capacitor 90. By virtue of the direct connection of the varactor 32 to the center conductor 86, it is heavily coupled to the resonator. The other varactor diode 34 is not so connected, but is coupled from the tuning port 30 to ground, and therefore is relatively lightly coupled to the resonator circuitry. The varactor diodes 32 and 34 comprise voltage variable capacitors and accordingly are controlled by DC voltages applied to the coarse tuning and fine tuning ports 28 and 30, respectively. These voltages are applied through RF chokes 92 and 94 which in combination with the feedthrough by-pass capacitors 96 and 98, prevent the $F_v$ signal from being coupled back to the circuitry connected to the tuning ports 28 and 30. The $F_v$ output signal however is coupled out of the cavity resonator by means of the coupling coil 100 which is connected to the output port 36.

The transistor oscillator additionally includes an RF choke 102 coupled to the base of transistor 82 which additionally receives a bias from a negative supply potential −V applied to terminal 104 by means of a voltage divider comprised of resistors 106 and 108. Additionally, by-pass capacitors 110 and 112 are connected to ground from the circuit junctions 114 and 116. The supply potential −V coupled to terminal 104 is also applied to the emitter of transistor 82 by means of resistor 118 and an RF choke 120. A by-pass capacitor 122 is also provided at the junction of resistor 118 and the choke coil 120 and a variable capacitance 124 is coupled from the emitter of transistor 82 to ground providing a means of controlling the magnitude of negative resistance of the oscillator.

The phase lock loop shown in FIG. 2 functions as follows. When the system is first energized or the reference frequency $F_r$ from the source 42 is changed, the relay switch contacts 70 are switched to the "sweep" position whereupon the integrator circuit 64 and the hysteresis amplifier 74 form a sweep circuit which sweeps the coarse tuning voltage applied to the coarse tuning port 28 of the VCO 24, moving the VCO frequency $F_v$ across a predetermined band of operation. As the VCO output frequency $F_v$ approaches the desired or correct locking frequency of $F_r + F_o$, whereupon an IF frequency $F_i = F_o$ is provided at the output of the mixer 40, the output of the "I" mixer 48 increases. The threshold device 54 is set such that it energizes the relay coil 72 or other suitable switch driver means at the desired locking frequency. Relay contacts 70 or other selected switch means now move to the "lock" position and the phase lock loop consisting of the VCO 24, the mixer 40, the IF limiter amplifier 44, the "Q" mixer 46, which acts as a phase detector, the video amplifier 56, and both tuning ports 28 and 30 of the VCO 24 is closed. The fine tuning port 30 is now directly connected to the output of the video amplifier 56 while the coarse tuning port 28 is coupled to the output of the integrator 64 which now has its input coupled to the output of the video amplifier 56 by means of the relay contact 70 and the resistor 71. Due to the dual coupling of the output of the video amplifier 56 to the coarse tuning port 28 and the fine tuning port 30, the loop configuration is such that the fine tuning voltage applied to port 30 is held at a substantially constant level. Consequently, the fine tune sensitivity remains essentially constant. Any departure from a predetermined DC level of the output of the video amplifier 56 drives the integrator 64 coupled to the coarse tuning port 28 in a direction such that the loop must drive the fine tuning port 30 back to the predetermined DC value which may be, for example, zero volts. Thus when the loop is locked, the integrator 64 forces the fine tune voltage to a preset value by virtue of incremental changes in the coarse tune voltage. This condition is held despite temperature changes, ageing, etc.

Figure 3:
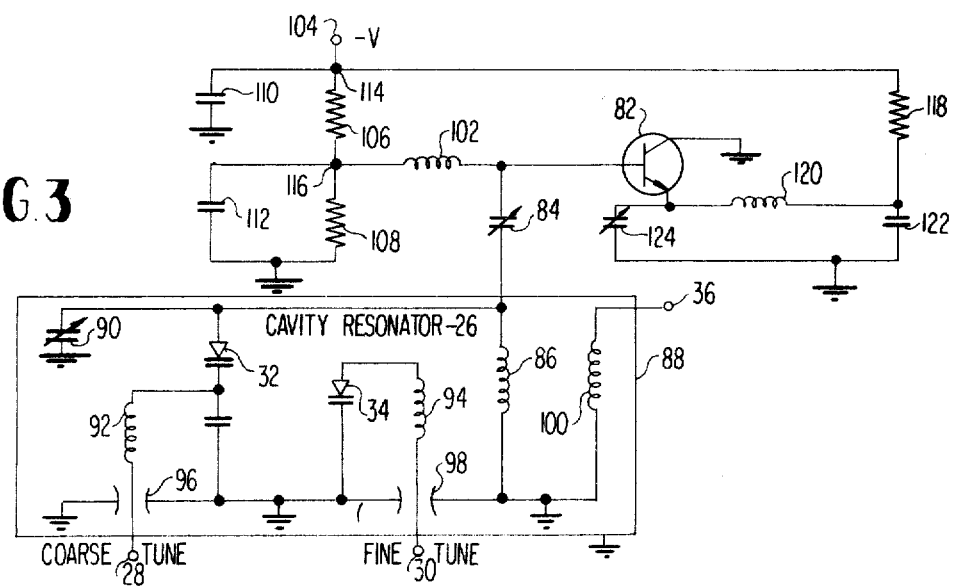
FIG. 3 is an electrical schematic diagram illustrative of a voltage controlled oscillator adapted for use in the embodiment shown in FIG. 2.

This operation is maintained by virtue of the two varactor diodes 32 and 34 shown in FIG. 3 wherein the diode 32 coupled to the course tune port 28 is more heavily coupled to the center conductor 86 of the coaxial resonator 26 than is the diode 34 coupled to the fine tuning port and which is lightly coupled to the inner conductor 86. The course tuning frequency-voltage characteristic is not required to be linear and may therefore assume the typical varactor tuning curve of the diode 32. The only constraint is that the coarse tuning circuitry is adapted to tune the band of interest monotonically by means of the applied voltage to the coarse tuning port 28. The configuration shown in FIG. 3 easily meets these requirements.

Since the fine tune voltage is held substantially constant at phase lock, the moderate to high frequency servo response is essentially invariant. When desirable, the residual variation with center frequency can be reduced by placing a relatively large resistor 69 across the integrator 64, i.e. in parallel with capacitor 68. This serves to cause the fine tune voltage to change slightly with coarse voltage change but with a corresponding change in fine tune sensitivity.

As to the prevention of false locking, if rather than the correct frequency the VCO had first tuned to the mirror image, false lock frequency, phase lock would attempt to occur around the loop described through the fine tuning port 30. However, the "I" mixer 48 would develop a DC voltage in an opposite sense since the loop sense is reverse. This prevents actuation of the threshold device 54 and consequently the sweep circuit operation will not become inoperative by actuation of the relay contacts 70. Since the coarse tuning port 28 has substantially larger dynamic range than the fine tune port 30, the sweep circuit forces the loop to continue the search for the correct lock frequency.

Subharmonic lock is prevented in a similar manner. The magnitude of the subharmonic signals is always about 10dB less than the correct or mirror lock points by virtue of appropriate limiter design of the amplifier 44. Additionally, appropriate choice of the threshold voltage for actuating the threshold device 54 prevents subharmonic locks from stopping the sweep, thereby forcing the loop to continue searching for the correct frequency.

The loop response of the configuration shown in FIG. 2 can be briefly summarized by noting that the loop bandwidth not only remains constant over the band of interest, but it suffers no problems during lock-up and there are no problems with low frequency servo loop instabilities, since it is a function of the coarse tuning voltage, whereas the high frequency response is determined by the fine tuning port.

The present invention has very practical advantages for low noise "Stalo" applications in that it allows the VCO to be optimized for noise performance while permitting its tuning linearity, ageing and temperature drift to assume almost arbitrary values whereas recent experience has shown that noise optimization tends to preclude optimization of these other parameters, particularly linearity. The present invention thus permits practical mass production of very low noise phase lock loops despite shortcomings of the VCO in areas other than noise performance.

Having thus disclosed what is at present considered to be the preferred embodiment of the subject invention.

We claim:

1. In a phase locked loop servo system adapted to phase lock a voltage controlled oscillator to a reference frequency signal wherein the system includes, a reference frequency source and a voltage controlled frequency source coupled to a signal mixer providing an IF signal therefrom, an offset frequency source providing an output frequency equal to the frequency of the IF signal at phase lock, phase detector means coupled to said IF signal and said offset frequency source providing an error signal output therefrom, and amplifier means coupled to said phase detector means providing a predetermined value of DC output voltage therefrom at phase lock, the improvement comprising:

a voltage controlled frequency source consisting of an oscillator having fine tuning means and coarse tuning means, said coarse tuning means being operable to tune the oscillator monotonically over a predetermined frequency band;

circuit means coupling the output of said amplifier means to said fine tuning means, said fine tuning means being responsive to said DC output voltage to fine tune the oscillator; and integrator circuit means coupling the output of said amplifier means to said coarse tuning means and being responsive to a departure of said DC output voltage from said predetermined value to tune the frequency of said oscillator until said predetermined value of DC voltage is again applied to said fine tuning means, whereby the tuning sensitivity of the fine tuning means is substantially constant across said predetermined frequency band and the bandwidth of the phase lock loop remains substantially constant.

2. The system as defined by claim 1 wherein said oscillator includes a cavity resonator and wherein said fine tuning means and said coarse tuning means are located in said resonator and wherein said coarse tuning means is relatively heavily coupled to the resonator and wherein said fine tuning means is relatively lightly coupled to said resonator.

3. The system as defined by claim 2 wherein said cavity resonator comprises a coaxial resonator having an inner and outer conductor, and wherein said fine tuning means and said coarse tuning means includes voltage variable capacitor means located within said outer conductor, and wherein said capacitor means included in said fine tuning means is loosely coupled to said inner conductor and said capacitor means included in said coarse tuning means is heavily coupled to said inner conductor.

4. The system as defined by claim 3 wherein both voltage variable capacitor means comprise varactor diodes and wherein said fine tuning means and said coarse tuning means each additionally include a respective signal port coupled to a respective varactor diode.

5. The system as defined by claim 4 and additionally including circuit means selectively coupled to said integrator means for providing a sweep circuit adapted to operate said coarse tuning means to sweep the frequency of said oscillator over said predetermined frequency band, and switch circuit means selectively coupling the input of said integrator circuit means either to said last recited circuit means or the output of said amplifier means.

6. The system as defined by claim 5 wherein said switch means is normally operative to connect said last recited circuit means to said integrator means and additionally including energizing means for operating said switch means to couple said integrator means to said amplifier means in response to a control signal applied to said energizing means; and means coupled to said IF signal and said offset oscillator for providing said control signal when phase lock occurs.

7. The system as defined by claim 6 wherein said means coupled to said IF signal means comprises a quadrature phase detector coupled to said IF signal and said offset frequency source and providing an output signal therefrom of varying amplitude, and a threshold device coupled to the output signal from said quadrature phase detector providing said control signal to operate said energizing means.

8. The system as defined by claim 7 wherein said quadrature phase detector comprises another signal mixer and a 90° phase shift network including circuit means coupling one input of said another mixer to said IF signal and circuit means coupling said 90° phase shift network between said offset oscillator and the other input of said another mixer.

9. The system as defined by claim 8 wherein said phase detector means comprises yet another mixer.

10. The system as defined by claim 9 wherein said amplifier means comprises a video operational amplifier having its input coupled to the output of said yet another mixer.

* * * * *